US012638398B2

(12) United States Patent
Lee et al.

(10) Patent No.:  US 12,638,398 B2
(45) Date of Patent:      May 26, 2026

(54) METHOD FOR GRAIN BOUNDARY ANALYSIS OF POLYCRYSTALLINE TWO-DIMENSIONAL MATERIALS

(71) Applicant: AJOU UNIVERSITY INDUSTRY-ACADEMIC COOPERATION FOUNDATION, Suwon-si (KR)

(72) Inventors: Jaehyun Lee, Bucheon-si (KR); Jiyun Moon, Yongin-si (KR); Jun-Hui Choi, Suwon-si (KR); Seung-il Kim, Suwon-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 488 days.

(21) Appl. No.: 18/166,032

(22) Filed: Feb. 8, 2023

(65) Prior Publication Data

US 2023/0251201 A1      Aug. 10, 2023

(30) Foreign Application Priority Data

Feb. 10, 2022      (KR) ........................ 10-2022-0017724

(51) Int. Cl.
| | |
|---|---|
| *C23C 16/00* | (2006.01) |
| *C23C 16/34* | (2006.01) |
| *G01N 21/65* | (2006.01) |

(52) U.S. Cl.
CPC ......... *G01N 21/658* (2013.01); *C23C 16/342* (2013.01)

(58) Field of Classification Search
CPC ...................................................... C23C 16/00
See application file for complete search history.

(56) References Cited

U.S. PATENT DOCUMENTS

| | | | | |
|---|---|---|---|---|
| 2013/0272951 A1* | 10/2013 | Hiura | ................ | H01L 21/02656 |
| | | | | 423/448 |
| 2014/0087191 A1* | 3/2014 | Chua | .................... | B32B 37/025 |
| | | | | 428/408 |
| 2017/0358420 A1* | 12/2017 | Liu | .................. | G01N 23/20058 |

FOREIGN PATENT DOCUMENTS

| | | |
|---|---|---|
| KR | 10-2224170 B1 | 3/2021 |
| KR | 10-2021-0067405 A | 3/2022 |
| WO | 2020/041650 A1 | 2/2020 |

OTHER PUBLICATIONS

"Interaction between metal and graphene: dependence on the layer number of graphene", Jisook Lee, Konstantin S. Novoselov, and Hyeon Suk Shin, ACS nano, vol. 5, No. 1, pp. 608-612, (Year: 2010).*

* cited by examiner

*Primary Examiner* — Gordon Baldwin
*Assistant Examiner* — Mohammad Mayy
(74) *Attorney, Agent, or Firm* — Sughrue Mion, PLLC

(57) ABSTRACT

The present disclosure relates to a method for analyzing a grain boundary of a polycrystalline two-dimensional material including transferring a polycrystalline two-dimensional material onto a substrate for analysis including a single crystalline two-dimensional material formed on a substrate; analyzing the polycrystalline two-dimensional material; depositing a metal thin film on the polycrystalline two-dimensional material; and exfoliating the polycrystalline two-dimensional material.

10 Claims, 3 Drawing Sheets
(1 of 3 Drawing Sheet(s) Filed in Color)

[FIG.1]
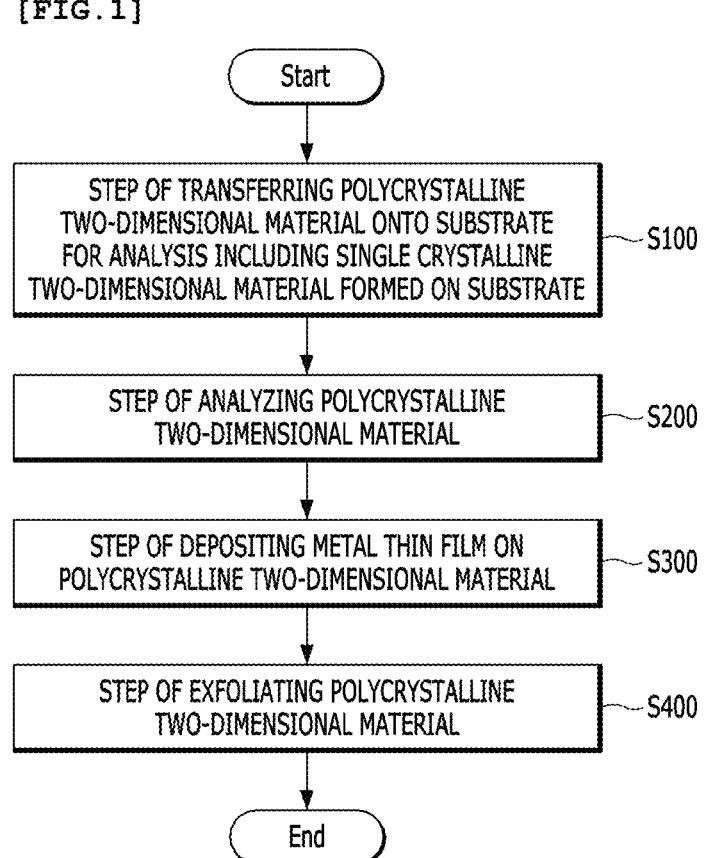

[FIG.2]
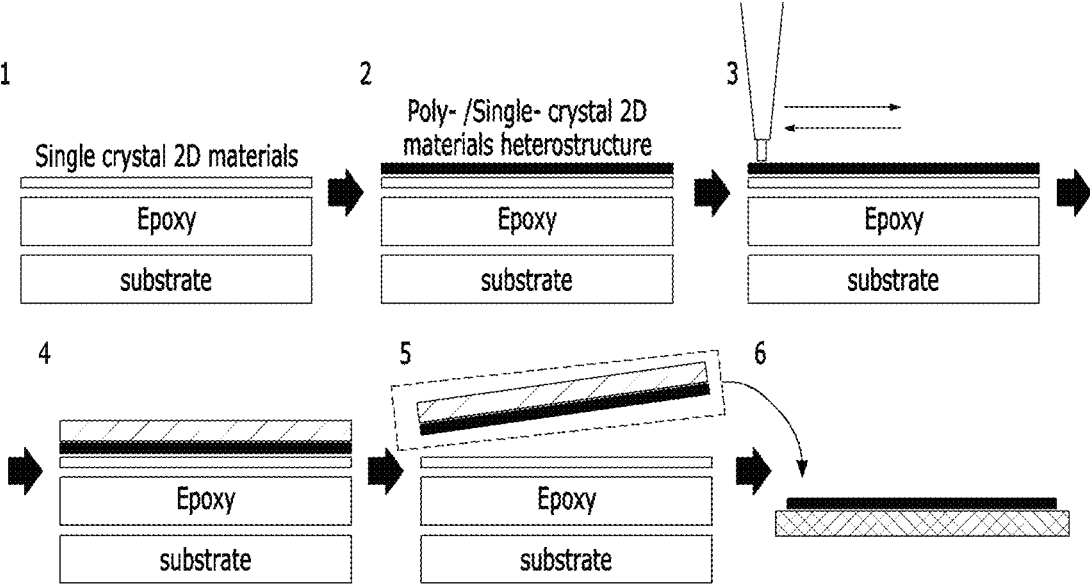

[FIG.3]
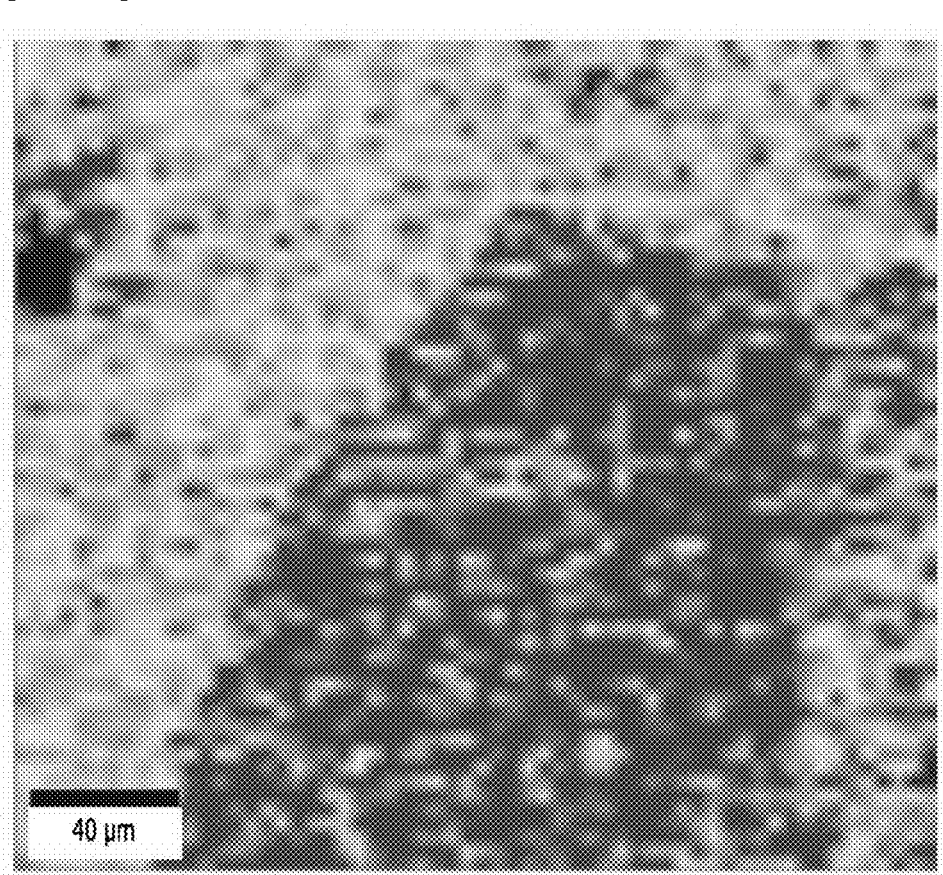

METHOD FOR GRAIN BOUNDARY ANALYSIS OF POLYCRYSTALLINE TWO-DIMENSIONAL MATERIALS

FIELD

The present disclosure relates to a method for analyzing a grain boundary of polycrystalline two-dimensional materials.

DESCRIPTION OF THE RELATED ART

Two-dimensional van der Waals materials, such as graphene, transition metal chalcogenide, and hexagonal boron nitride (h-BN), are attracting attention in various fields due to their excellent electrical, thermal, and mechanical properties. In order to apply the two-dimensional material to right fields in the actual industry, internal defect (grain boundary) control is essential and a technique for analyzing the defect needs to be also developed.

In order to synthesize the two-dimensional van der Waals materials with a controlled defect, research through chemical vapor deposition of various approaches has been successfully conducted, but the development of a grain boundary analysis method for synthesized two-dimensional materials is relatively insufficient.

The most widely known grain boundary analysis methods include those using TEM and STM, but there are problems in that an analyzable range is limited to several nm to several μm and it is difficult to prepare a specimen so that there a limit to application to industrial fields that require large-area and non-destructive analysis.

Accordingly, it is necessary to develop a grain interface analysis method of a large-area and non-destructive two-dimensional method.

Korean Registered Patent No. 10-2224170 relates to analysis method of physical property of graphene. The cited Patent discloses an observation method to identify physical and topological properties of the graphene using a special substrate and scanning electron microscope (FE-SEM) equipment in various forms, but does not mention a large-area and non-destructive analysis method using a Raman spectroscopy.

CONTENT OF THE INVENTION

Problem to be Solved

The present disclosure has been made an effort to solve the problem of the related art and provides a method for analyzing a grain boundary of polycrystalline two-dimensional materials.

Further, a preparing method of a polycrystalline two-dimensional material in which the grain boundary analysis is completed is provided.

Further, a polycrystalline two-dimensional material in which the grain boundary analysis is completed is prepared by a preparing method of a polycrystalline two-dimensional material in which the grain boundary analysis is completed.

However, objects to be achieved by various embodiments of the present disclosure are not limited to the technical objects as described above and other technical objects may be present.

Problem Solving Means

As a technical means to achieve the above-described technical object, according to a first aspect of the present disclosure, a method for analyzing a grain boundary of polycrystalline two-dimensional materials includes: transferring a polycrystalline two-dimensional material onto a substrate for analysis including a single crystalline two-dimensional material formed on a substrate; analyzing the polycrystalline two-dimensional material; depositing a metal thin film on the polycrystalline two-dimensional material; and exfoliating the polycrystalline two-dimensional material.

According to the implementation example of the present disclosure, the step of transferring the exfoliated polycrystalline two-dimensional material onto an additional substrate may be further included, but is not limited thereto.

According to the implementation example of the present disclosure, the binding force of the metal thin film and the polycrystalline two-dimensional material is larger than the binding force of the polycrystalline two-dimensional material and the single crystalline two-dimensional material and may be smaller than the binding force of the single crystalline two-dimensional material and the substrate, but is not limited thereto.

According to the implementation example of the present disclosure, the binding force of the metal thin film and the polycrystalline two-dimensional material may be adjustable according to a type of the metal, but is not limited thereto.

According to the implementation example of the present disclosure, the step of analyzing the polycrystalline two-dimensional material is performed by the Raman spectroscopy, but is not limited thereto.

According to one implementation example of the present disclosure, the step of depositing the metal thin film may be performed by a method selected from the group consisting of E-beam evaporation, thermal evaporation, vacuum thermal evaporation, plasma deposition, sputtering, atomic layer deposition (ALD), chemical vapor deposition (CVD), physical vapor deposition (PVD), and combinations thereof, but is not limited thereto.

According to the implementation example of the present disclosure, the metal may include one selected from the group consisting of Ag, Au, Cu, and combinations thereof, but is not limited thereto.

According to the implementation example of the present disclosure, the single crystalline two-dimensional material and the polycrystalline two-dimensional material may, independently, include one selected from the group consisting of transition metal chalcogenide, graphene, fluorographene, graphene oxide, hexagonal boron nitride (h-BN), boron carbon nitride (BCN), black phosphorus, and combinations thereof, but is not limited thereto.

According to the implementation example of the present disclosure, the transition metal chalcogenide includes a material denoted by the following Chemical Formula 1, but is not limited thereto.

$$MX_2 \qquad \text{[Chemical Formula 1]}$$

(In the above Chemical Formula 1, M is a transition metal selected from Mo, W, Te, Re, V, Nb, Ta, Ti, Zr, Hf, Co, Rh, Ir, Ni, Pd, or Pt and X is a chalcogenide element selected from S, Se, or Te).

According to the implementation example of the present disclosure, the substrate may include a substrate selected from the group consisting of epoxy, polydimethylsiloxane (PDMS), polyethylene, polypropylene, polyvinyl chloride resin, polyethylene terephthalate (PET), nylon, polyimide, polyester, urethane, acryl, polycarbonate, urea, melanin, chlorinated rubber, polyvinyl alcohol, polyvinyl ester, poly-vinylidene fluoride (PVDF), and combinations thereof, but is not limited thereto.

Further, a second aspect of the present disclosure provides a preparing method of a polycrystalline two-dimensional material in which the grain boundary analysis is completed including transferring a polycrystalline two-dimensional material onto a substrate for analysis including a single crystalline two-dimensional material formed on a substrate; analyzing the polycrystalline two-dimensional material; depositing a metal thin film on the polycrystalline two-dimensional material; and exfoliating the polycrystalline two-dimensional material.

Further, according to a third aspect of the present disclosure, a polycrystalline two-dimensional material in which grain boundary analysis is completed, prepared by the preparing method according to the second aspect of the present disclosure is provided.

Effects of the Invention

The above-described solving means are merely illustrative but should not be construed as limiting the present disclosure. In addition to the above-described embodiments, additional embodiments may be further provided in the drawings and the detailed description of the present disclosure.

The method for analyzing a grain boundary of polycrystalline two-dimensional materials according to the present disclosure is a method for non-destructively analyzing a substrate for analysis including a polycrystalline two-dimensional material to be analyzed and a single crystalline two-dimensional material for analyzing the polycrystalline two-dimensional material, thereby reusing the material to be analyzed and the template after completing the analysis, which is economical compared to the method for analyzing a grain boundary of two-dimensional materials of the related art.

Specifically, after performing the grain boundary analysis by Raman spectroscopy by depositing a polycrystalline two-dimensional material on a single crystalline two-dimensional material, a metal thin film is deposited on the polycrystalline two-dimensional material in consideration of the difference of binding forces between interfaces to selectively exfoliate only the polycrystalline two-dimensional material which is a material to be analyzed. Accordingly, the substrate for analysis including the single crystalline material is reusable and the polycrystalline two-dimensional material which is completely analyzed is transferred onto the other substrate to be utilized where necessary.

Further, the method for analyzing a grain boundary of polycrystalline two-dimensional materials according to the present disclosure may analyze the polycrystalline two-dimensional material with a large area, unlike the related art in which the analyzable range is limited to several nm to several μm.

However, the effect which can be achieved by the present disclosure is not limited to the above-described effects, there may be another effects.

BRIEF DESCRIPTION OF THE DRAWINGS

The patent or application file contains at least one drawing executed in color. Copies of this patent or patent application publication with color drawings will be provided by the Office upon request and payment of the necessary fee.

The above and other aspects, features and other advantages of the present disclosure will be more clearly understood from the following detailed description taken in conjunction with the accompanying drawings, in which:

FIG. 1 is a flowchart of a method for analyzing a grain boundary of polycrystalline two-dimensional materials according to an implementation example of the present disclosure;

FIG. 2 is a diagram of a method for analyzing a grain boundary of polycrystalline two-dimensional materials according to an implementation example of the present disclosure; and FIG. 3 is a grain boundary mapping image of a graphene analyzed by a method for analyzing a grain boundary of polycrystalline two-dimensional materials according to an implementation example of the present disclosure.

DETAILED DESCRIPTION OF THE EMBODIMENT

Hereinafter, the present disclosure will be described more fully hereinafter with reference to the accompanying drawings, in which exemplary embodiments of the present disclosure are shown. However, the present disclosure can be realized in various different forms, and is not limited to the embodiments described herein. Accordingly, in order to clearly explain the present disclosure in the drawings, portions not related to the description are omitted. Like reference numerals designate like elements throughout the specification.

Throughout this specification and the claims that follow, when it is described that an element is "coupled" to another element, the element may be "directly coupled" to the other element or "electrically coupled" to the other element through a third element.

Throughout the specification of the present disclosure, when one member is located "on", "above", "on an upper portion", "below", "under", and "on a lower portion" of the other member, the member may be adjacent to the other member or a third member may be disposed between the above two members.

Throughout the specification of the present disclosure, unless explicitly described to the contrary, the word "comprise" and variations such as "comprises" or "comprising", will be understood to imply the inclusion of stated elements but not the exclusion of any other elements.

The terms "about or approximately" or "substantially" indicating a degree used throughout the specification are used as a numerical value or a meaning close to the numerical value when a unique manufacturing and material tolerance is proposed to the mentioned meaning and also used to prevent unscrupulous infringers from wrongfully using the disclosure in which precise or absolute numerical values are mentioned for better understanding of the present disclosure. Terms used throughout the specification, "~step of ~ing" or "step of~" do not mean "step for~".

Throughout the specification of the present disclosure, the term "combination thereof" included in the expression of Markushi format refers to a mixture or a combination of one or more selected from the group consisting of components described in the expression of the Markushi format and it means that one or more selected from the group consisting of the components is included.

Throughout the specification of the present disclosure, the description of "A and/or B" refers to "A, B, or, A and B".

Hereinafter, a method for analyzing a grain boundary of polycrystalline two-dimensional materials of the present disclosure will be described in detail with reference to implementation examples, exemplary embodiments, and drawings. However, the present disclosure is not limited to the embodiments, the examples, and the drawings.

As a technical means to achieve the above-described technical object, according to a first aspect of the present disclosure, a method for analyzing a grain boundary of polycrystalline two-dimensional materials includes: transferring a polycrystalline two-dimensional material onto a substrate for analysis including a single crystalline two-dimensional material formed on a substrate; analyzing the polycrystalline two-dimensional material; depositing a metal thin film on the polycrystalline two-dimensional material; and exfoliating the polycrystalline two-dimensional material.

The method for analyzing a grain boundary of polycrystalline two-dimensional materials according to the present disclosure is a method for non-destructively analyzing a substrate for analysis including a polycrystalline two-dimensional material to be analyzed and a single crystalline two-dimensional material for analyzing the polycrystalline two-dimensional material, thereby reusing the material to be analyzed and the template after completing the analysis, which is economical compared to the method for analyzing a grain boundary of a two-dimensional material of the related art.

Specifically, after performing the crystal boundary analysis by Raman spectroscopy by depositing a polycrystalline two-dimensional material on a single crystalline two-dimensional material, a metal thin film is deposited on the polycrystalline two-dimensional material in consideration of the difference of binding forces between interfaces to selectively exfoliate only the polycrystalline two-dimensional material which is a material to be analyzed. Accordingly, the substrate for analysis including the single crystalline material is reusable and the polycrystalline two-dimensional material which is completely analyzed is transferred onto the other substrate to be utilized where necessary.

Further, the method for analyzing a grain boundary of polycrystalline two-dimensional materials according to the present disclosure may analyze the polycrystalline two-dimensional material with a large area, unlike the related art in which the analyzable range is limited to several nm to several μm.

FIG. 1 is a flowchart of a method for analyzing a grain boundary of polycrystalline two-dimensional materials according to an implementation example of the present disclosure.

FIG. 2 is a diagram of a method for analyzing a grain boundary of polycrystalline two-dimensional materials according to an implementation example of the present disclosure.

First, a polycrystalline two-dimensional material is transferred onto a substrate for analysis including a single crystalline two-dimensional material formed on a substrate (S100).

Referring to FIG. 2, the substrate for analysis includes a single crystalline two-dimensional material on a surface and a polycrystalline two-dimensional material to be analyzed is transferred onto the single crystalline two-dimensional material to perform the grain boundary analysis.

According to the implementation example of the present disclosure, the single crystalline two-dimensional material and the polycrystalline two-dimensional material may, independently, include one selected from the group consisting of transition metal chalcogenide, graphene, fluorographene, graphene oxide, hexagonal boron nitride (h-BN), boron carbon nitride (BCN), black phosphorus, and combinations thereof, but is not limited thereto.

According to the implementation example of the present disclosure, the transition metal chalcogenide includes a material denoted by the following Chemical Formula 1, but is not limited thereto.

$$MX_2 \hspace{4cm} \text{[Chemical Formula 1]}$$

(In the above Chemical Formula 1, M is a transition metal selected from Mo, W, Te, Re, V, Nb, Ta, Ti, Zr, Hf, Co, Rh, Ir, Ni, Pd, or Pt and X is a chalcogenide element selected from S, Se, or Te).

According to the implementation example of the present disclosure, the substrate may include a substrate selected from the group consisting of epoxy, polydimethylsiloxane (PDMS), polyethylene, polypropylene, polyvinyl chloride resin, polyethylene terephthalate (PET), nylon, polyimide, polyester, urethane, acryl, polycarbonate, urea, melanin, chlorinated rubber, polyvinyl alcohol, polyvinyl ester, polyvinylidene fluoride (PVDF), and combinations thereof, but is not limited thereto.

Next, the polycrystalline two-dimensional material is analyzed (S200).

According to the implementation example of the present disclosure, the step of analyzing the polycrystalline two-dimensional material is performed by the Raman spectroscopy, but is not limited thereto.

In the step S200 of analyzing the polycrystalline two-dimensional material, an area of the polycrystalline two-dimensional material which is necessary to be analyzed is scanned and mapped using the Raman spectroscopy to extract information, such as a grain boundary position and an angle of the polycrystalline two-dimensional material. At this time, a scanning size may be designated to be small or large depending on a size of an area to be analyzed so that the area is divided to perform the scanning several times or a large area may be scanned at one time.

Next, the metal thin film is deposited on the polycrystalline two-dimensional material (S300).

When the metal thin film is deposited, the deposition needs to be performed in consideration of the binding force between interfaces. The binding force between interfaces was calculated through binding force-related literature and experimental confirmation.

According to the implementation example of the present disclosure, the binding force of the metal thin film and the polycrystalline two-dimensional material is larger than the binding force of the polycrystalline two-dimensional material and the single crystalline two-dimensional material and may be smaller than the binding force of the single crystalline two-dimensional material and the substrate, but is not limited thereto.

Hereinafter, for the convenience of description, a binding force of the metal thin film and the polycrystalline two-dimensional material is referred to as a first binding force, a binding force of the polycrystalline two-dimensional material and the single crystalline two-dimensional material is referred to as a second binding force, and a binding force of the single crystalline two-dimensional material and the substrate is referred to as a third binding force.

When the first binding force is smaller than the second binding force, the polycrystalline two-dimensional material is not exfoliated from a surface of the single crystalline two-dimensional material and when the first binding force is larger than the third binding force, the polycrystalline two-dimensional material may be damaged.

Accordingly, when the binding force (first binding force) of the metal thin film and the polycrystalline two-dimensional material is larger than the binding force (second binding force) of the polycrystalline two-dimensional material and the single crystalline two-dimensional material, and is smaller than the binding force (third binding force) of the single crystalline two-dimensional material and the substrate, the polycrystalline two-dimensional material may be non-destructively and selectively exfoliated in the exfoliating step to be described below.

According to the implementation example of the present disclosure, the binding force of the metal thin film and the polycrystalline two-dimensional material may be adjustable according to a type of the metal, but is not limited thereto.

The binding force (first binding force) of the metal thin film and the polycrystalline two-dimensional material is adjustable depending on a type of the metal to be deposited and as described above, the type of metal to be deposited needs to be selected in consideration of the binding force of each interface. According to the implementation example of the present disclosure, the depositing of the metal thin film is performed by a method selected from the group consisting of E-beam evaporation, thermal evaporation, vacuum thermal evaporation, plasma deposition, sputtering, atomic layer deposition (ALD), chemical vapor deposition (CVD), physical vapor deposition (PVD), and combinations thereof, but is not limited thereto.

According to the implementation example of the present disclosure, the metal may be one selected from the group consisting of Ag, Au, Cu, and combinations thereof, but is not limited thereto.

Next, the polycrystalline two-dimensional material is exfoliated (S400).

As described above, in the step S300 of depositing the metal thin film on the polycrystalline two-dimensional material, the polycrystalline two-dimensional material may be non-destructively exfoliated from a surface of the single crystalline two-dimensional material by the deposition in consideration of the binding force between interfaces.

According to the implementation example of the present disclosure, the step of transferring the exfoliated polycrystalline two-dimensional material onto an additional substrate may be further included, but is not limited thereto.

The single crystalline two-dimensional material and the polycrystalline two-dimensional material are non-destructively exfoliated to reuse the substrate for analysis including the single crystalline material and the polycrystalline two-dimensional material in which the analysis is completed is transferred onto the additional substrate to be utilized where necessary.

Further, a second aspect of the present disclosure provides a preparing method of a polycrystalline two-dimensional material in which the grain boundary analysis is completed including transferring a polycrystalline two-dimensional material onto a substrate for analysis including a single crystalline two-dimensional material formed on a substrate; analyzing the polycrystalline two-dimensional material; depositing a metal thin film on the polycrystalline two-dimensional material; and exfoliating the polycrystalline two-dimensional material.

A detailed description of repeated parts of the preparing method of a polycrystalline two-dimensional material in which the grain boundary analysis is completed according to the second aspect of the present disclosure with the first aspect of the present disclosure will be omitted. However, even though the detailed description thereof is omitted, the description of the first aspect of the present disclosure may be applied to the second aspect of the present disclosure in the same manner.

The preparing method of a polycrystalline two-dimensional material in which the grain boundary analysis is completed according to the present disclosure is a method for non-destructively analyzing a substrate for analysis including a polycrystalline two-dimensional material to be analyzed and a single crystalline two-dimensional material for analyzing the polycrystalline two-dimensional material and thus, the polycrystalline two-dimensional material in which the grain boundary analysis is completed is transferred onto the other substrate to be utilized where necessary.

Further, the method of crystal boundary analysis of a polycrystalline two-dimensional material according to the present disclosure may analyze the polycrystalline two-dimensional material with a large area, unlike the related art in which the analyzable range is limited to several nm to several μm.

Further, according to a third aspect of the present disclosure, a polycrystalline two-dimensional material in which grain boundary analysis is completed, prepared by the preparing method according to the second aspect of the present disclosure, is provided.

A detailed description of repeated parts of the polycrystalline two-dimensional material in which the grain boundary analysis is completed, according to the third aspect of the present disclosure with the first aspect and/or the second aspect of the present disclosure will be omitted. However, even though the detailed description thereof is omitted, the description of the first aspect and/or the second aspect of the present disclosure may be applied to the third aspect of the present disclosure in the same manner.

Hereinafter, the present disclosure will be described in more detail with respect to examples, but the following examples are set forth to illustrate, but are not to be construed to limit the scope of the present disclosure.

EXAMPLE

Analysis of Grain Boundary of Polycrystalline Two-Dimensional Material

Prior to the analysis, a substrate for analysis was prepared by transferring a single crystalline graphene onto a substrate having a strong binding force.

A polycrystalline graphene was transferred on the substrate for analysis to form a polycrystalline graphene/single crystalline graphene/substrate structure.

Next, Raman mapping was performed to analyze the structure (polycrystalline graphene/single crystalline graphene/substrate). At this time, a scale and a position of the Raman mapping image vary depending on a size and a position of the area to be analyzed.

With regard to this, when the polycrystalline graphene/single crystalline graphene were laminated, the Raman peak intensity and a ratio of a G peak which is a unique graphene peak and 2D peak vary depending on the crystal grain of the polycrystalline so that the scanned Raman mapping image (intensity of G & 2D peak, G/2D ratio) does not have the uniform color, but has different colors depending on the crystal grain of the polycrystal.

After completing the analysis, an appropriate metal was deposited on the structure (polycrystalline graphene/single crystalline graphene/substrate) in consideration of the binding force between layers and only the polycrystalline graphene was exfoliated. As described above, the single crystalline graphene was transferred onto the substrate having a strong binding force so that the signal crystalline graphene was strongly bound with the substrate so as not to be exfoliated.

FIG. 3 is a grain boundary mapping image of a graphene analyzed by a method of grain boundary analysis of a polycrystalline two-dimensional material according to an implementation example of the present disclosure.

Referring to FIG. 3, it may be confirmed that the image is divided into a red area, a green area, and a yellow area, which indicate different grains.

The above-description of the present disclosure is illustrative only and it may be understood by those skilled in the art that the present disclosure may be easily modified to another specific type without changing the technical spirit of an essential feature of the present disclosure. Thus, it is to be appreciated that embodiments described above are intended to be illustrative in every sense, and not restrictive. For example, each component which is described as a singular form may be divided to be implemented and similarly, components which are described as a divided form may be combined to be implemented.

The scope of the present disclosure is represented by the claims to be described below rather than the detailed description, and it is to be interpreted that the meaning and scope of the claims and all the changes or modified forms derived from the equivalents thereof come within the scope of the present disclosure.

What is claimed is:

1. A method for analyzing a grain boundary of polycrystalline two-dimensional materials, the method comprising:
transferring a polycrystalline two-dimensional material onto a substrate for analysis, wherein a single crystalline two-dimensional material is formed on the substrate;
analyzing the polycrystalline two-dimensional material;
depositing a metal thin film on the polycrystalline two-dimensional material; and
exfoliating the polycrystalline two-dimensional material, wherein a binding force of the metal thin film and the polycrystalline two-dimensional material is larger than a binding force of the polycrystalline two-dimensional material and the single crystalline two-dimensional material and is smaller than a binding force of the single crystalline two-dimensional material and the substrate.

2. The method for analyzing a grain boundary according to claim 1, further comprising:
transferring the exfoliated polycrystalline two-dimensional material onto an additional substrate.

3. The method for analyzing a grain boundary according to claim 1, wherein the binding force of the metal thin film and the polycrystalline two-dimensional material is adjusted depending on a type of the metal.

4. The method for analyzing a grain boundary according to claim 1, wherein the analyzing of the polycrystalline two-dimensional material is performed by a Laman spectroscopy.

5. The method for analyzing a grain boundary according to claim 1, wherein the depositing of the metal thin film is performed by a method selected from the group consisting of E-beam evaporation, thermal evaporation, vacuum thermal evaporation, plasma deposition, sputtering, atomic layer deposition (ALD), chemical vapor deposition (CVD), physical vapor deposition (PVD), and combinations thereof.

6. The method for analyzing a grain boundary according to claim 1, wherein the metal includes one selected from the group consisting of Ag, Au, Cu, and combinations thereof.

7. The method for analyzing a grain boundary according to claim 1, wherein the single crystalline two-dimensional material and the polycrystalline two-dimensional material independently include one selected from the group consisting of transition metal chalcogenide, graphene, fluorographene, graphene oxide, hexagonal boron nitride (h-BN), boron carbon nitride (BCN), black phosphorus, and combinations thereof.

8. The method for analyzing a grain boundary according to claim 7, wherein the transition metal chalcogenide includes a material denoted by the following Chemical Formula 1, $$MX_2 \qquad \text{[Chemical Formula 1]}$$

(In the above Chemical Formula 1, M is a transition metal selected from Mo, W, Te, Re, V, Nb, Ta, Ti, Zr, Hf, Co, Rh, Ir, Ni, Pd, or Pt and X is a chalcogenide element selected from S, Se, or Te).

9. The method for analyzing a grain boundary according to claim 1, wherein the substrate includes a substrate selected from the group consisting of epoxy, polydimethylsiloxane (PDMS), polyethylene, polypropylene, polyvinyl chloride resin, polyethylene terephthalate (PET), nylon, polyimide, polyester, urethane, acryl, polycarbonate, urea, melanin, chlorinated rubber, polyvinyl alcohol, polyvinyl ester, polyvinylidene fluoride (PVDF), and combinations thereof.

10. A preparing method of a polycrystalline two-dimensional material in which a grain boundary analysis is completed, the method comprising:
transferring a polycrystalline two-dimensional material onto a substrate for analysis, wherein a single crystalline two-dimensional material is formed on the substrate;
analyzing the polycrystalline two-dimensional material;
depositing a metal thin film on the polycrystalline two-dimensional material; and
exfoliating the polycrystalline two-dimensional material, wherein a binding force of the metal thin film and the polycrystalline two-dimensional material is larger than a binding force of the polycrystalline two-dimensional material and the single crystalline two-dimensional material and is smaller than a binding force of the single crystalline two-dimensional material and the substrate.

* * * * *